United States Patent
Kobatake

[11] Patent Number: 6,009,027
[45] Date of Patent: Dec. 28, 1999

[54] TEST METHOD AND CIRCUIT FOR SEMICONDUCTOR MEMORY

[75] Inventor: Hiroyuki Kobatake, Tokyo, Japan

[73] Assignee: NEC Corporation, Tokyo, Japan

[21] Appl. No.: 09/049,057

[22] Filed: Mar. 27, 1998

[30] Foreign Application Priority Data

Apr. 1, 1997 [JP] Japan .................................... 9-082869

[51] Int. Cl.[6] .................................................. G11C 7/00
[52] U.S. Cl. ................ 365/201; 365/185.29; 365/230.04
[58] Field of Search .............................. 365/201, 185.29, 365/185.33, 230.04

[56] References Cited

U.S. PATENT DOCUMENTS

| | | |
|---|---|---|
| 4,502,131 | 2/1985 | Giebel . |
| 4,744,058 | 5/1988 | Kawashima et al. . |
| 5,440,518 | 8/1995 | Hazani ............................ 365/185.33 X |

FOREIGN PATENT DOCUMENTS

| | | |
|---|---|---|
| 0 410 492 A2 | 7/1990 | Japan . |
| 5-334900 | 12/1993 | Japan . |
| 9-7380 | 1/1997 | Japan . |

*Primary Examiner*—Huan Hoang
*Attorney, Agent, or Firm*—McGinn & Gibb, P.C.

[57] ABSTRACT

A checkerboard data pattern is written in a semiconductor memory with a simple arrangement. First, memory cell transistors M00–M77 are erased. A test signal TS is turned to "L," an address ax0 to "1," write signals D0, D2, D4 and D6 to "1." This causes "1" to be written in the memory cell transistors even-numbered in both the rows and columns. Then, the test signal TS is turned to "L," an X address ax0 to "0," write signals D1, D3, D5 and D7 to "1." This causes "1" to be written in the memory cell transistors odd-numbered in both the rows and columns. Thus, the checkerboard can be written with a simple arrangement by activating only the least significant bit ax0 of X addresses ax2–ax0.

6 Claims, 5 Drawing Sheets

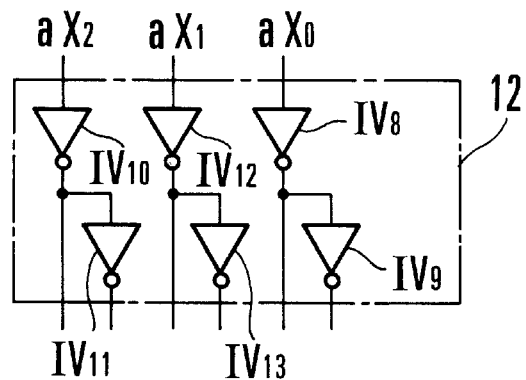
FIG. 2
FIG. 3 A  TS 
FIG. 3 B  aX₀ 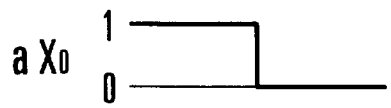
FIG. 3 C  D₀ 
FIG. 3 D  D₁ 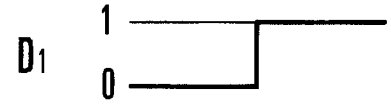
FIG. 3 E  D₂ 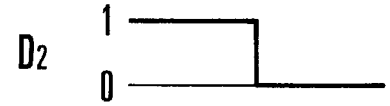
FIG. 3 F  D₃ 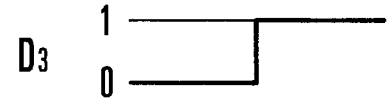
FIG. 3 G  D₄ 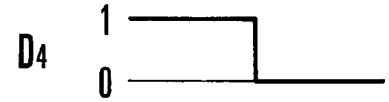
FIG. 3 H  D₅ 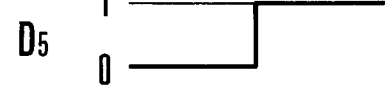
FIG. 3 I  D₆ 
FIG. 3 J  D₇ 

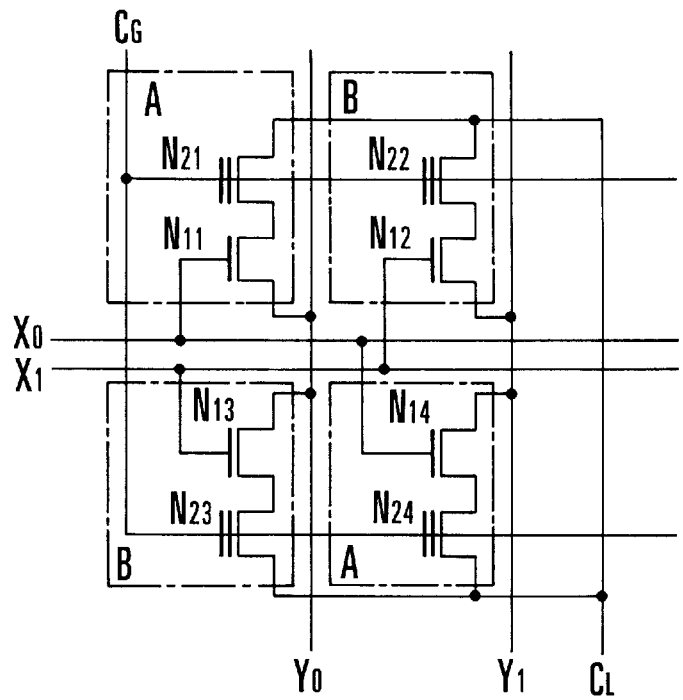
F I G. 4
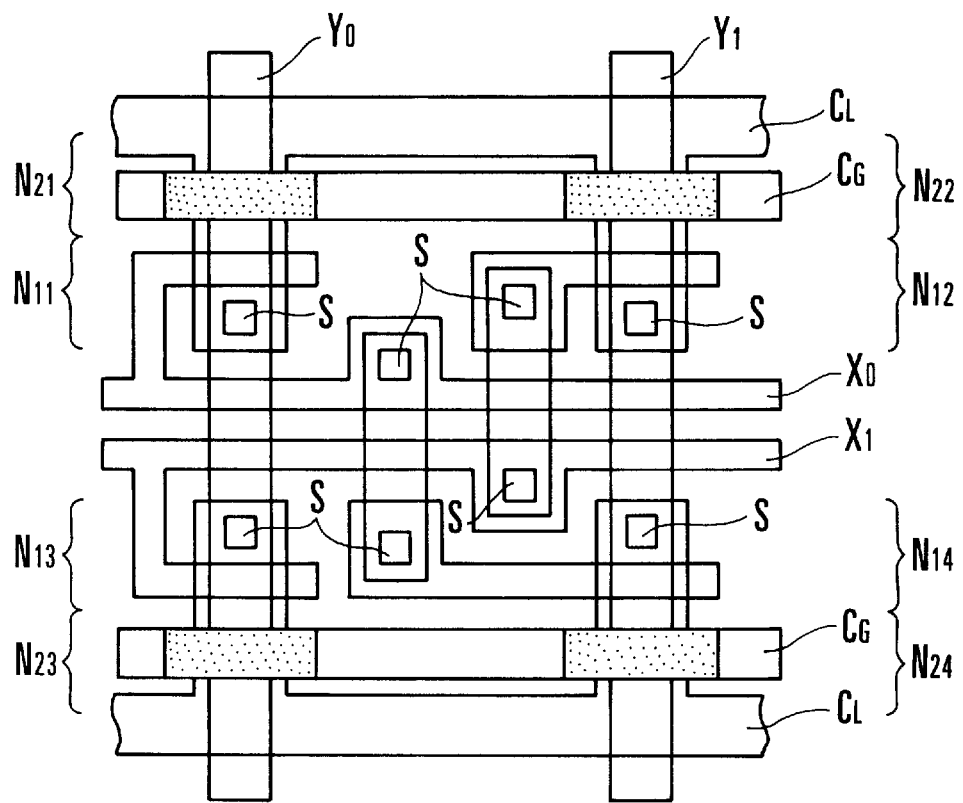
F I G. 5

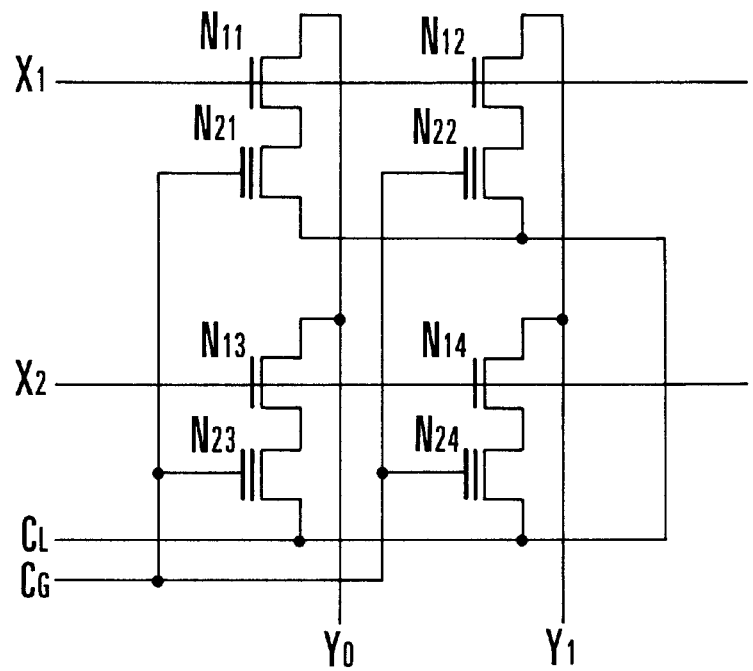
F I G. 6
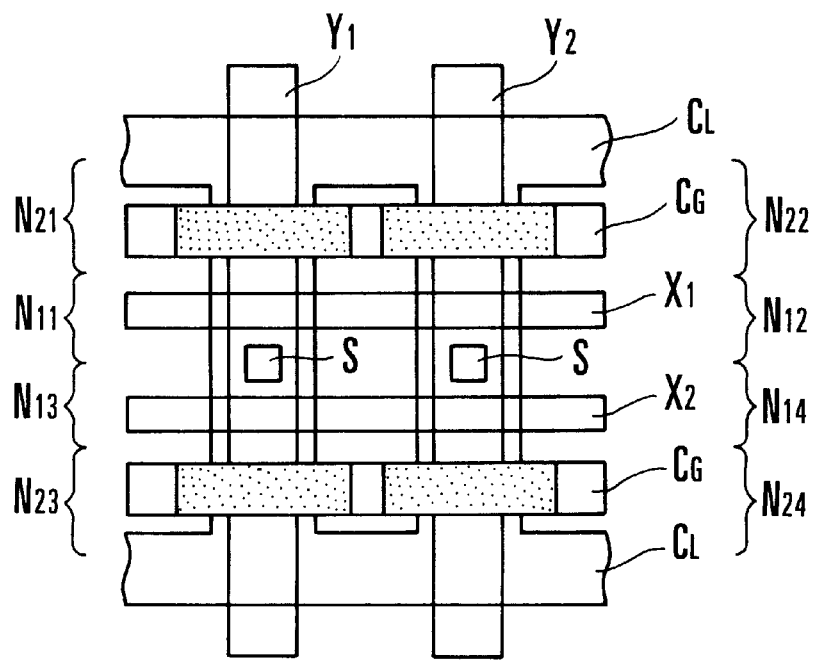
F I G. 7

TEST METHOD AND CIRCUIT FOR SEMICONDUCTOR MEMORY

BACKGROUND OF THE INVENTION

The present invention relates to a method and circuit for testing a semiconductor memory such as EEPROM or flash EEPROM, and, more particularly, to a method and circuit for testing a semiconductor memory by writing a checkerboard data pattern.

Conventionally, a semiconductor memory has been tested using test items such as all bits "1," all bits "0" or a checkerboard (1s and 0s are alternately written in adjacent memory cells on a layout). Since a nonvolatile memory takes about 1 msec per one word for writing, writing time occupies a very high ratio in a test time. Thus, some of tests are simplified to shorten the test time. In this case, checkerboard writing is essential for checking interference between bits. Then, for example, to write a checkerboard in a 128 k byte memory, it takes a very long time of 128 k×1 msec=128 sec.

In view of the above, there have been proposed semiconductor memories for which the write time can be shortened (Japanese Patent Application Laid-Open Nos. 5-334900 and 9-7380).

FIG. 4 shows a block diagram of a memory cell array disclosed in Japanese Patent Application Laid-open No. 5-334900. The memory cell array constitutes one memory cell with one set of N-channel MOS transistors N11–N12 and one set of memory cell transistors N21–N24. A control gates of the memory cell transistors N21–N24 are connected to a signal line $C_G$, their sources to a signal line $C_L$, their drain to sources of the N-channel transistors N11–N14. Drains of the N-channel transistors N11 and N13 are connected to a data select line Y0, drains of the transistors N12 and N14 to a data select line Y1, gates of the transistors N11 and N14 to an address select line X0, gates of the transistors N12 and N13 to an address select line X1.

To write a checkerboard in such memory cell array, all memory cells are first erased (all to "0"), followed by setting even-numbered address select lines X0 to "H," odd-numbered address select lines X1 to "L," and data select lines Y0 and Y1 to "H" to apply a high voltage to the signal line $C_G$, and to apply the ground voltage to the signal line $C_L$. This turns on the N-channel transistors N11 and N14 in the memory cell A, thereby electrons being written in floating gates of the memory cell transistors N21 and N24. This would mean that "1" is written in the memory cell A. The memory cell B remains "0."

As such, the memory cell array disclosed in Japanese Patent Application Laid-Open No. 5-334900 can write a checkerboard at a time by crossing the address select lines X0 and X1.

However, this memory cell array has a problem that the memory cell array becomes complicated to attain the above arrangement, causing a larger memory cell array area. FIG. 5 shows a plan view of this memory cell array, FIG. 6 shows a block diagram of a conventional memory cell array in which address select lines are not crossed, and FIG. 7 shows a plan view of the memory cell array of FIG. 6. In FIGS. 5 and 7, S denotes a through hole. As clearly seen from FIG. 5, the memory cell array in which the address select lines are crossed should have a larger number of through holes to connect crossing address select lines, and has a larger area than the memory cell array of FIG. 7 in which the address select lines are not crossed.

Then, FIG. 8 shows a block diagram of a semiconductor memory disclosed in Japanese Patent Application Laid-open No. 9-7380. The semiconductor memory comprises a memory cell array 21 in which a plurality of memory cell transistors are arranged in a matrix, a word line WL connecting to a control gate of a memory cell transistor in each row, a digit line DL connecting to a drain of a memory cell transistors in each column, an X decoder 22 for selecting one word line specified by a row address signal ADr during writing operation, a word line voltage generator circuit 23, a Y decoder 24 and a column select circuit 25 for selecting one digit line specified by a column address signal ADc during the writing operation, and a write circuit 26.

This circuit differs from a conventional one in that further one input is added to a logic gate G23 corresponding to each word line of the X decoder 22 to make an odd-numbered logic gate G23o and an even-numbered logic gate G23e, and that an odd-numbered signal ODr is arranged to be input into an input terminal added with the logic gate G23o, an even-numbered signal EVr to an input terminal added with the logic gate G23e. In addition, further one input is added to a logic gate G43 corresponding to each digit line of the Y decoder 24 to make an odd-numbered logic gate G43o and an even-numbered logic gate G43e. Then, it is arranged that an odd-numbered signal ODc is input into an input terminal added with the logic gate G43o, and an even-numbered signal EVc is added to the input terminal added with the logic gate G43e.

To write a checkerboard in the memory cell array 21, after all memory cells are erased, a write voltage is applied from the word line voltage generator circuit 23 and the write circuit 26 by turning the control signal ACN to "H," the odd-numbered signals ODr and ODc to "L," and the even-numbered signals EVr and EVc to "H." This turns the output of the odd-numbered logic gate G23o to "H" to turn on the odd-numbered N-channel transistor Q22o, thereby the odd-numbered word line WLo becoming 0 V. In addition, the output of the even-numbered logic gate G23e is turned to "L" to turn on the even-numbered P-channel transistor Q21e, thereby the write voltage being applied from the word line voltage generator circuit 23 to the even-numbered word line WLe. On the other hand, the output of the odd-numbered logic gate G43o becomes "H," and the output of the odd-numbered inverter IV42o becomes "L" to turn off the transistor Q5o. The output of the even-numbered logic gate G43e becomes "L," and the output of the even-numbered inverter IV42e becomes "H" to turn on the transistor Q5e, thereby the write voltage being applied from the write circuit 26 to the even-numbered digit line DLe. Thus, "1" is written in all even-numbered memory cell transistors MCee for both the rows and the columns.

Subsequently, a write voltage is applied from the word line voltage generator circuit 23 and the write circuit 26 by turning the control signal ACN to "H," odd-numbered signals ODr and ODc to "H," and the even-numbered signals EVr and EVc to "L." This turns the output of the odd-numbered logic gate G23o to "L" to turn on the odd-numbered P-channel transistor Q21o, thereby the write voltage being applied to the odd-numbered word line WLo. In addition, the output of the odd-numbered logic gate G43o is turned to "L," and the output of the odd-numbered inverter IV42o is turned to "H" to turn on the transistor Q5o, thereby the write voltage being applied from the write circuit 26 to the odd-numbered digit line DLo. Thus, "1" is written in all odd-numbered memory cell transistors MCoo for both the rows and the columns.

Consequently, "1" is written in the memory cell transistors MCee even-numbered in both the rows and the columns and the memory cell transistors MCoo odd-numbered in both the rows and the columns, while "0" is written in the memory cell transistors MCeo even-numbered in the rows and odd-numbered in the columns, and the memory cell transistors MCoe odd-numbered in the rows and even-numbered in the columns.

However, such semiconductor memory has such problem that additional input terminals should be provided for the input terminals for the logic gate G23 of the X decoder 22 and the logic gate G43 of the Y decoder 24 to increase the signal lines ODr, EVr, ODc, and EVc, so that the X and Y decoders become complicated.

SUMMARY OF THE INVENTION

As described above, the semiconductor memory disclosed in Japanese Patent Application Laid-Open No. 5-334900 has a problem that the arrangement of memory cell array becomes complicated, thereby increasing the area of memory cell array.

In addition, the semiconductor memory disclosed in Japanese Patent Application Laid-open No. 9-7380 has a problem that the circuits for the X and Y decoders become complicated, thereby increasing the areas of X and Y decoders.

The present invention is made to solve the above problems, and intended to provide a test method and a test circuit enabling a simple arrangement to write a checkerboard data pattern in a semiconductor memory.

According to a first aspect of the present invention, the present invention comprises the steps of erasing data in all memory cell transistors; activating only specific bits of X addresses to select either all even-numbered word lines or all odd-numbered word lines, setting a write signal to select either all even-numbered bit lines or all odd-numbered bit lines, and writing data in selected memory cell transistors; and activating only specific bits of X addresses to select unselected word lines, setting a write signal to select unselected bit lines, and writing data in selected memory cell transistors. In such a way, either all even-numbered word lines or all odd-numbered word lines are selected by activating only specific bits of X addresses input into the X decoder, and either all even-numbered bit lines or all odd-numbered bit lines are selected by setting a write signal. Thus, it becomes possible to write data in the memory cell transistors either even-numbered or odd-numbered in rows, and either even-numbered or odd-numbered in columns, and then to write data in the memory cell transistors unselected for both the rows and columns (for example, if the even-numbered ones are selected, select odd-numbered ones), so that a checkerboard can be written in two write operations.

According to a second aspect, the specific bit is the least significant bit.

In addition, according to a third aspect, the present invention comprises a memory cell array in which a plurality of memory cell transistors are arranged in a matrix, word lines connected to control gates of the memory cell transistors in each row, bit lines connected to drains of the memory cell transistors in each column, an X decoder for selecting predetermined word lines according to an external X address, a write circuit for selecting predetermined bit lines according to an external write signal, and means for activating only specific bits of the X addresses input into the X decoder to select either all even-numbered word lines or all odd-numbered word lines.

In addition, according to a fourth aspect, the specific bit is the least significant bit.

BRIEF DESCRIPTION OF THE DRAWINGS

FIG. 2 is a block diagram of a conventional pre-decoder circuit;

FIG. 3A–3J are waveforms of an X address and a write signal;

FIG. 4 is a block diagram of a conventional memory cell array;

FIG. 5 is a plan view of the memory cell array of FIG. 4;

FIG. 6 is a block diagram of an ordinary memory cell array in which address select lines are not crossed;

FIG. 7 is a plan view of the memory cell array of FIG. 6; and

DESCRIPTION OF THE PREFERRED EMBODIMENTS

Figure 1:
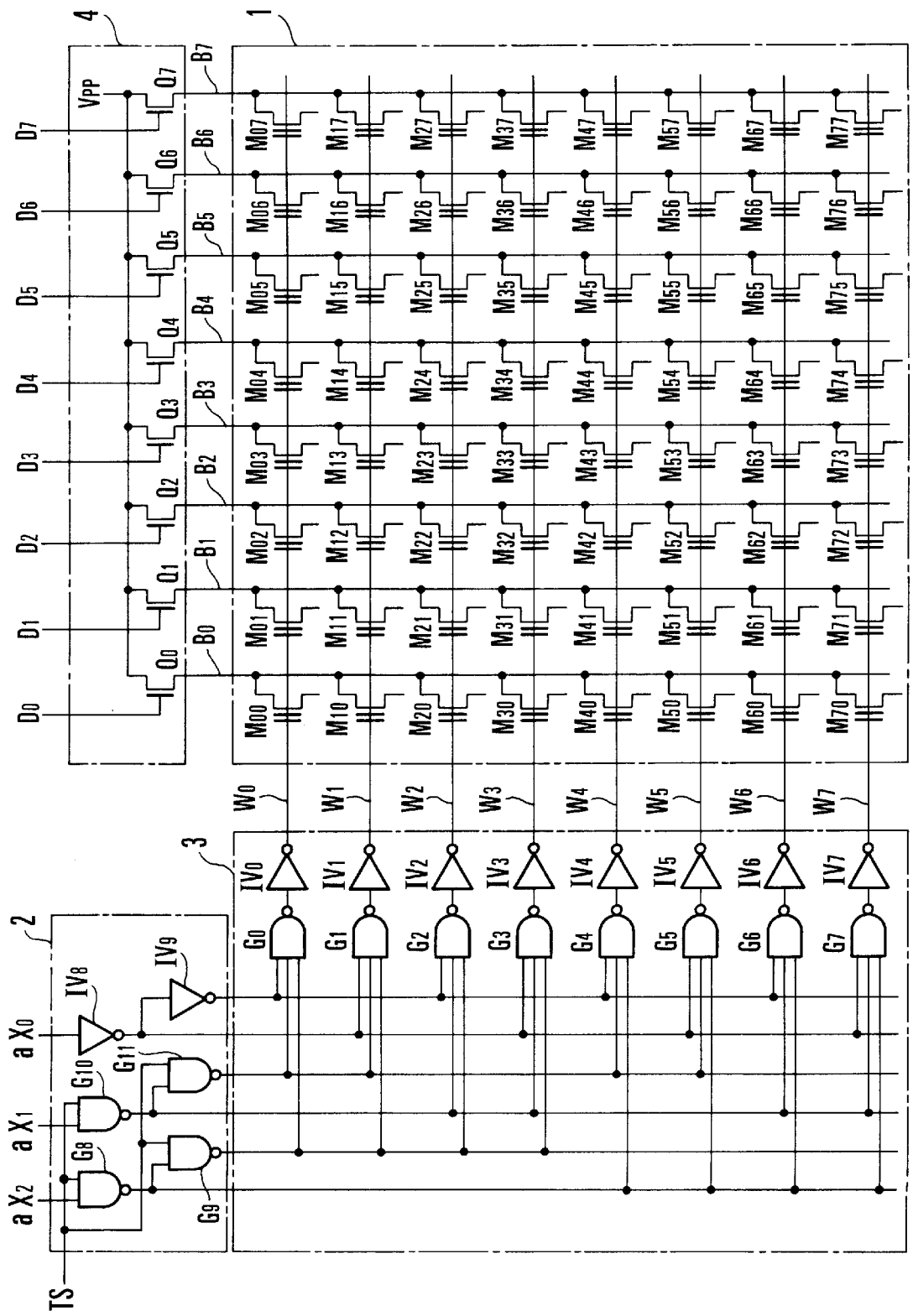
FIG. 1 is a block diagram showing an embodiment of the present invention.
Figure 8:
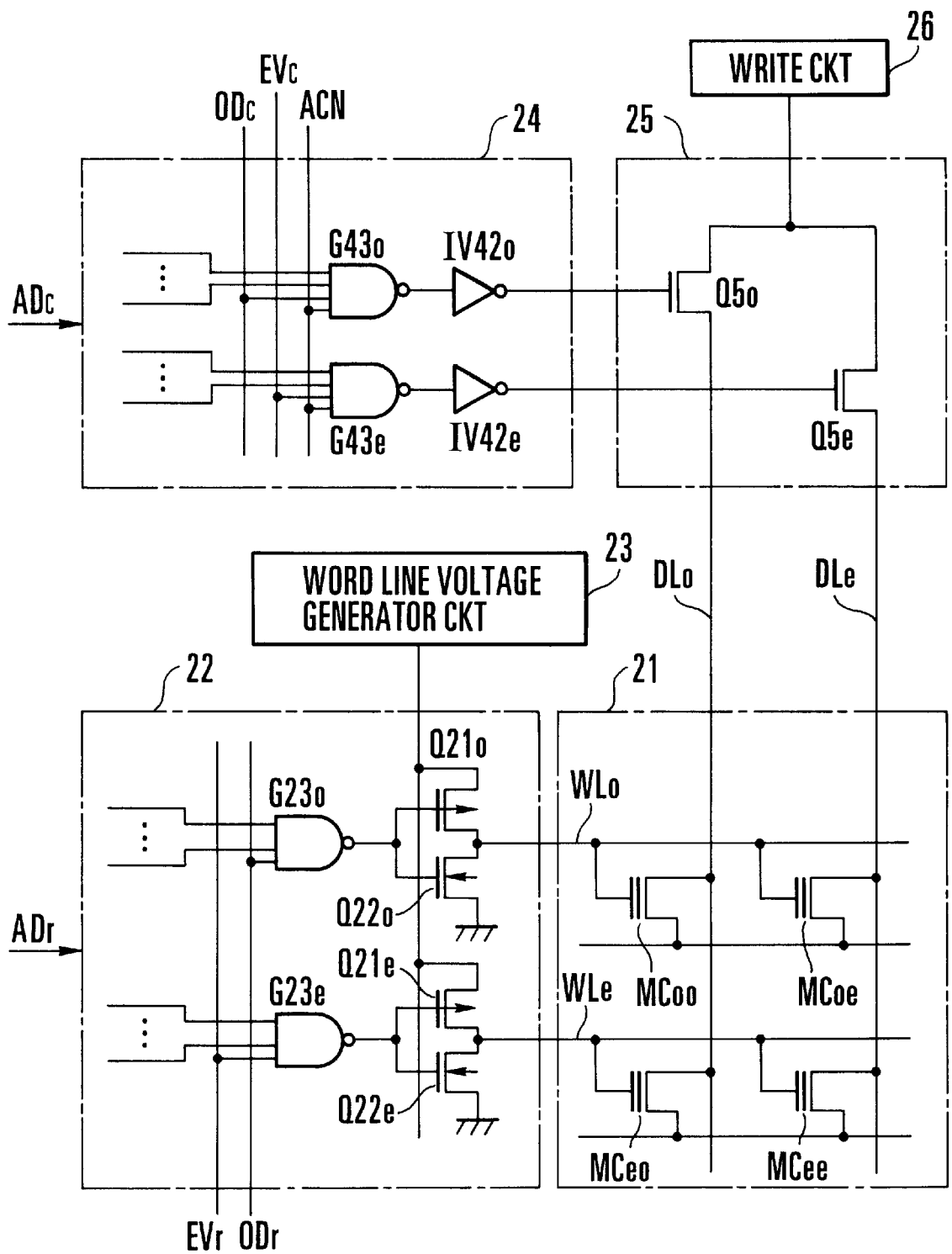
FIG. 8 is a block diagram of a conventional semiconductor memory.

Now, an embodiment of the present invention is described with reference to the drawings. FIG. 1 is a block diagram of a semiconductor memory showing an embodiment of the present invention.

The semiconductor memory comprises a memory cell array 1 in which memory cell transistors M00–M77 are arranged in a matrix, word lines W0–W7 connected to control gates of the memory cell transistors M00–M07, M10–M17, M20–M27, M30–M37, M40–M47, M50–M57, M60–M67, and M70–77 in each row, respectively, bit lines B0–B7 connected to drains of the memory cell transistors M00–M70, M01–M71, M02–M72, M03–M73, M04–M74, M05–M75, M06–M76, and M07–M77 in each column, respectively, an X (row) decoder for selecting predetermined word lines according to an external X address, and a write circuit 4 for selecting predetermined bit lines according to an external write signal.

The X decoder comprises a pre-decoder circuit 2 into which 3-bit X addresses ax2–ax0 are input, and a main decoder circuit 3 into which an output signal of the pre-decoder circuit 2 is input.

Then, the pre-decoder circuit 2 comprises a NAND gate G8 into which the most significant X address ax2 and a test signal TS, which will be described later, are input, a NAND gate G9 into which an output signal of the NAND gate G8 and the test signal TS are input, a NAND gate G10 into which the X address ax1 and the test signal TS are input, a NAND gate G11 into which an output signal of the NAND gate G10 and the test signal TS are input, an inverter gate IV8 into which the least significant X address ax0 is input, and an inverter gate IV9 into which an output signal of the inverter gate IV8 is input.

The pre-decoder circuit 2 is the conventional pre-decoder circuit 12 shown in FIG. 2 in which inverter gates IV10 and IV11 are replaced with the NAND gates G8 and G9, and inverter gates IV12 and IV13 are replaced with the NAND gates G10 and G11.

In addition, the main decoder circuit 3 comprises NAND gates G0–G7 corresponding to the word lines W0–W7, respectively, and inverter gates IV0–IV7 into which outputs of the NAND gates G0–G7 are input, respectively, and outputs of which are connected to the word lines W0–W7, respectively.

The write circuit 4 comprises n-channel transistors Q0–Q7 into gates of which write signals D0–D7 are input from write signal generator means (not shown), to drains of which a positive voltage Vpp is applied from voltage generator means (not shown), and sources of which are connected to the bit lines B0–B7, respectively.

Now, an operation is described for writing a checkerboard data pattern into such semiconductor memory.

The transistors Q0–Q7 are turned off, or all bit lines B0–B7 are unselected (floated) by setting all word lines W0–W7 to a negative potential. Electrons are extracted from floating gates of all the memory cell transistors M00–M77 to erase all memory cell transistors by setting source lines connected to the sources of all the memory cell transistors M00–M77 to a positive potential.

Subsequently, the source lines connected to the sources of all memory cell transistors M00–M77 are set to 0 V by turning the test signal TS shown in FIG. 3A to an "L" level to turn the X address ax0 from address generator means (not shown) to "1" (FIG. 3B), and by turning even-numbered write signals D0, D2, D4, and D6 to "1" and odd-numbered write signals D1, D3, D5, and D7 to "0" (FIGS. 3C–3J).

When the test signal TS is turned from "H" to "L," the X addresses ax2 and ax1 are invalidated by the pre-decoder circuit 2, and only the least significant X address ax0 is validated (activated).

Since the test signal TS is "L," and the X address ax0 is "1" here, all outputs of the NAND gates G8–G11 in the pre-decoder circuit 2 are turned to "H," output of the inverter gate IV8 is turned "L," and output of the inverter gate IV9 is turned "H." This causes outputs of the even-numbered NAND gates G0, G2, G4 and G6 in the main decoder circuit 3 to be turned to "L," thereby a high voltage (for example, 10 V) being applied to outputs of the even-numbered inverter gates IV0, IV2, IV4 and IV6, or the even-numbered word lines W0, W2, W4 and W6.

In addition, since outputs of the odd-numbered NAND gates G1, G3, G5 and G7 are turned to "H," outputs of the odd-numbered inverter gates IV1, IV3, IV5 and IV7 or the odd-numbered word lines W1, W3, W5 and W7 become 0 V.

Although various voltages may exist as the voltage applied to the word lines W0–W7 (for example, different potential may occur even for the same "H" level), they can be changed over by a change-over circuit (not shown) in the inverter gates IV0–IV7.

On the other hand, as the even-numbered write signals D0, D2, D4 and D6 become "1," the write circuit 4 turns on the even-numbered N-channel transistors Q0, Q2, Q4 and Q6 to apply a positive voltage Vpp to the even-numbered bit lines B0, B2, B4 and B6. At the moment, the odd-numbered bit lines B1, B3, B5 and B7 are at 0 V.

Then, "1" is written in the memory cell transistors as the even-numbered memory cell transistors M00, M02, M04, M06, M20, M22, M24, M26, M40, M42, M44, M46, M60, M62, M64 and M66 are selected for both the rows and columns, and electrons are injected into the floating gates of these memory cell transistors.

Then, the source lines connected to the sources of all memory cell transistors M00–M77 is set to 0 V by holding the test signal TS at an "L" level, turning the X address ax0 from the address generator means to "0" (FIG. 3B), turning the even-numbered write signals D0, D2, D4 and D6 to "0" with the write signal generator means, and turning the odd-numbered write signals D1, D3, D5 and D7 to "1" (FIGS. 3C–3J).

Since the test signal TS is "L," and the X address ax0 is "0," all outputs of the NAND gates G8–G11 in the pre-decoder circuit 2 are turned to "H," output of the inverter gate IV8 is turned to "H," and output of the inverter circuit IV9 is turned to "L." This causes output of the even-numbered NAND gates G0, G2, G4 and G6 in the main decoder circuit 3 to be turned to "H," thereby outputs of the even-numbered inverter gates IV0, IV2, IV4 and IV6, or the even-numbered word lines W0, W2, W4 and W6 becoming 0 V.

Then, since outputs of the odd-numbered NAND gates G1, G3, G5 and G7 become "L," a high voltage is applied to outputs of the odd-numbered inverter gates IV1, IV3, IV5 and IV7, or the odd-numbered word lines W1, W3, W5 and W7.

On the other hand, as the odd-numbered write signals D1, D3, D5 and D7 become "1," the write circuit 4 turns on the odd-numbered N-channel transistors Q1, Q3, Q5 and Q7 to apply a positive voltage Vpp to the odd-numbered bit lines B1, B3, B5 and B7. At the moment, the even-numbered bit lines B0, B2, B4 and B6 are at 0 V.

Then, "1" is written in the memory cell transistors as the odd-numbered memory cell transistors M11, M13, M15, M17, M31, M33, M35, M37, M51, M53, M55, M57, M71, M73, M75, and M77 are selected for both the rows and columns, and electrons are injected into the floating gates of these memory cell transistors.

Thus, when "1" is written in the memory cell transistors even-numbered in both the rows and columns, and, subsequently "1" is written in the memory cell transistors odd-numbered in both the rows and columns, "0" would have been written in remaining memory cell transistors according to the erasure described above. Therefore, a checkerboard data pattern would be written in the memory cell array 1.

In this manner, a checkerboard data pattern can be written in the memory cell array 1 in two write operations, so that, for example, for a 128 k byte memory, writing operation can be completed in such a short period of time of 2×1 msec=2 msec.

Then, according to the present invention, writing of a checkerboard data pattern can be attained with a simple arrangement because the memory cell array 1, the main decoder circuit 3, the write circuit 4 and the like may be of the same arrangement as in the prior art, and it is sufficient to modify only a part of the pre-decoder circuit for activating only the least significant X address ax0.

While the embodiment first writes "1" in the memory cell transistors even-numbered in both the rows and columns followed by writing "1" in the memory cell transistors odd-numbered in both the rows and columns, it is a matter of course to reverse such order.

In addition, it may be possible to perform writing in the memory cell transistors even-numbered in the rows (X address being "1") and odd-numbered in the columns (signals D1, D3, D5 and D7 being "1" and signals D0, D2, D4 and D6 being "0"), followed by writing in the memory cell transistors odd-numbered in the rows (X address being "0") and even-numbered in the columns (signals D1, D3, D5 and D7 being "0" and signals D0, D2, D4 and D6 being "1").

Furthermore, while the embodiment uses the memory cell transistors for which writing is performed by applying a positive voltage to the control gate and the drain, since the present invention does not depend on the structure of memory cell array or X decoder (main decoder circuit), it may be possible to use memory cell transistors for which writing is performed by applying a negative voltage or 0 V to the control gate and a positive voltage to the drain. Furthermore, the present invention is not limited to a flash EEPROM as described above, but may be applied to an EEPROM or SRAM.

According to the present invention, as described for the first aspect, since either all even-numbered bit lines or all odd-numbered bit lines are selected by activating only specific bits of X addresses to select either all even-numbered word lines or all odd-numbered word lines, and setting a write signal, it is sufficient to add an arrangement for activating only specific bits of X addresses, so that a checkerboard data pattern can be written with a simple arrangement. In addition, since the checkerboard data pattern can be written in the memory cell array in two writing operations, the writing time can be shortened.

In addition, as described for the third aspect, since the test circuit for semiconductor memory comprises a memory cell array, word lines, bit lines, an X decoder, a write circuit, and means for activating only specific bits of X addresses input into the X decoder, it is possible to implement a test circuit for writing a checkerboard data pattern in the memory cell array only by adding the means activating only specific bits of X addresses.

What is claimed is:

1. A test method for writing a checkerboard data pattern in a semiconductor memory, said semiconductor memory having a memory cell array in which a plurality of memory cell transistors are arranged in a matrix, word lines connected to control gates of the memory cell transistors in each row, bit lines connected to drains of the memory cell transistors in each column, an x decoder for selecting predetermined word lines according to external x addresses, and a write circuit for selecting predetermined bit lines according to an external write signal, said method comprising:

erasing data in all memory cell transistors;

activating only a specific bit of respective ones of said X addresses to select either all even-numbered word lines or all odd-numbered word lines, setting a write signal to select either all even-numbered bit lines or all odd-numbered bit lines, and writing data in selected memory cell transistors; and activating only a specific bit of respective ones of said X addresses to select unselected word lines, setting a write signal to select unselected bit lines, and writing data in selected memory cell transistors.

2. The test method for semiconductor memory as set forth in claim 1, wherein said specific bit is the least significant bit.

3. A test circuit for semiconductor memory comprising:

a memory cell array in which a plurality of memory cell transistors are arranged in a matrix;

word lines connected to control gates of the memory cell transistors in each row;

bit lines connected to drains of the memory cell transistors in each column;

an X decoder for selecting predetermined word lines according to an external X address;

a write circuit for selecting predetermined bit lines according to an external write signal; and means for activating only specific bits of said X addresses input into said X decoder.

4. The test circuit for semiconductor memory as set forth in claim 3, wherein said specific bit is the least significant bit.

5. A test circuit for a semiconductor memory, comprising:

a memory cell array in which a plurality of memory cell transistors are arranged in a matrix;

word lines connected to control gates of the memory cell transistors in each row;

bit lines connected to drains of the memory cell transistors in each column;

an X decoder for selecting predetermined word lines according to an external X address;

a write circuit for selecting predetermined bit lines according to an external write signal; and a pre-decoder circuit for activating only a specific bit of respective ones of said X addresses input into said X decoder.

6. The test circuit for a semiconductor memory as set forth in claim 5, wherein said specific bit is the least significant bit.

* * * * *